(12) United States Patent
Kim

(10) Patent No.: US 9,899,352 B2
(45) Date of Patent: Feb. 20, 2018

(54) DATA STORAGE DEVICE AND AN ELECTRONIC DEVICE INCLUDING THE SAME

(71) Applicant: SAMSUNG ELECTRONICS CO., LTD., Suwon-si, Gyeonggi-Do (KR)

(72) Inventor: Kilsoo Kim, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 38 days.

(21) Appl. No.: 15/277,366

(22) Filed: Sep. 27, 2016

(65) Prior Publication Data

US 2017/0103965 A1    Apr. 13, 2017

(30) Foreign Application Priority Data

Oct. 12, 2015  (KR) .................. 10-2015-0142307

(51) Int. Cl.
*H01L 25/18*   (2006.01)
*H01L 25/065*  (2006.01)

(52) U.S. Cl.
CPC .......... *H01L 25/0652* (2013.01); *H01L 25/18* (2013.01); *H01L 2224/16227* (2013.01); *H01L 2225/06513* (2013.01); *H01L 2225/06548* (2013.01); *H01L 2225/06555* (2013.01); *H01L 2225/06582* (2013.01); *H01L 2225/06589* (2013.01); *H01L 2924/15311* (2013.01)

(58) Field of Classification Search
CPC ... H01L 25/06; H01L 25/065; H01L 25/0652; H01L 25/18; H01L 2225/06

USPC ......................................................... 257/777
See application file for complete search history.

(56) References Cited

U.S. PATENT DOCUMENTS

| 6,798,667 B2 | 9/2004 | Chan |
| 8,115,291 B2 | 2/2012 | Baek et al. |
| 8,253,244 B2 | 8/2012 | Kang |
| 8,299,595 B2 | 10/2012 | Yoon et al. |
| 8,791,562 B2 | 7/2014 | Lee et al. |
| 8,952,517 B2 | 2/2015 | Kwon et al. |
| 2014/0151859 A1 | 6/2014 | Kim et al. |
| 2014/0209926 A1* | 7/2014 | Takatani ............. H01L 23/5228 257/77 |
| 2014/0327129 A1 | 11/2014 | Cho et al. |
| 2015/0113195 A1 | 4/2015 | Kim |
| 2015/0130078 A1 | 5/2015 | Hong et al. |
| 2016/0141271 A1* | 5/2016 | Lee .................... H01L 25/0657 257/712 |

FOREIGN PATENT DOCUMENTS

| KR | 1020140130920 | 11/2014 |
| KR | 1020150054551 | 5/2015 |

* cited by examiner

*Primary Examiner* — Monica D Harrison
(74) *Attorney, Agent, or Firm* — F. Chau & Associates, LLC

(57) ABSTRACT

A data storage device may include a package substrate, and an upper semiconductor chip disposed above a top surface of the package substrate. At least one lower bump is disposed on a bottom surface of the package substrate. A lower semiconductor chip is disposed on the bottom surface of the package substrate and spaced apart from the at least one lower bump. The lower semiconductor chip is thinner than the at least one lower bump.

20 Claims, 5 Drawing Sheets

DATA STORAGE DEVICE AND AN ELECTRONIC DEVICE INCLUDING THE SAME

CROSS-REFERENCE TO RELATED APPLICATION

This U.S. non-provisional patent application claims priority under 35 U.S.C. § 119 to Korean Patent Application No. 10-2015-0142307, filed on Oct. 12, 2015, in the Korean Intellectual Property Office, the disclosure of which is incorporated by reference herein in its entirety.

TECHNICAL FIELD

Exemplary embodiments of the present inventive concept relate to a data storage device, and more particularly to an electronic device including the same.

DISCUSSION OF RELATED ART

Semiconductor devices may have high performance, high functionality, and high density. Various semiconductor package structures (e.g., POP (package-on-package): and MCP (multi-chip-package) structures) have been developed. However, heat may be generated in semiconductor package structures, and thus a semiconductor chip may be damaged, or functional or performance characteristics of the semiconductor devices may be reduced.

SUMMARY

One or more exemplary embodiments of the present inventive concept may provide a data storage device configured to efficiently discharge heat and an electronic device including the same.

According to one or more exemplary embodiments of the inventive concept, a data storage device includes a package substrate, and an upper semiconductor chip disposed above a top surface of the package substrate. At least one lower bump is disposed on a bottom surface of the package substrate. A lower semiconductor chip is disposed on the bottom surface of the package substrate and spaced apart from the at least one lower bump. The lower semiconductor chip is thinner than the at least one lower bump.

The upper semiconductor chip may include a first memory chip, and the lower semiconductor chip may include a control chip controlling the first memory chip.

The data storage device may include a second memory chip disposed on the bottom surface of the package substrate and spaced apart from the control chip.

The package substrate may include a first interconnection line connecting the control chip to the first memory chip and extending in a first direction, and a second interconnection line connecting the at least one lower bump to the control chip and extending a second direction crossing the first direction.

The data storage device may include a mold layer disposed on the bottom surface of the package substrate.

The at least one lower bump may include a through-mold via passing through the mold layer.

The data storage device may include a passive device disposed on the package substrate and spaced apart from the upper semiconductor chip.

The data storage device may include at least one upper bump disposed between the upper semiconductor chip and the package substrate.

The package substrate may include a third interconnection line connecting the at least one upper bump to the passive device.

The data storage device may include a radiation element disposed on a bottom surface of the control chip. A stack thickness of the control chip and the radiation element may be smaller than a thickness of the at least one lower bump.

According to one or more exemplary embodiments of the inventive concept, an electronic device includes a main substrate and a data storage device disposed on a top surface of the main substrate. The data storage device includes a package substrate smaller than the main substrate. An upper semiconductor chip is disposed above a top surface of the package substrate. At least one lower bump is disposed on a bottom surface of the package substrate. A lower semiconductor chip is disposed on the bottom surface of the package substrate and spaced apart from the at least one lower bump. The lower semiconductor chip is thinner than the at least one lower bump.

The electronic device may include a first radiation element disposed on a bottom surface of the lower semiconductor chip. A stack thickness of the lower semiconductor chip and the first radiation element may be smaller than a thickness of the at least one lower bump.

The data storage device may include a mold layer disposed between the package substrate and the main substrate. The at least one lower bump may include a through-mold via passing through the mold layer.

The mold layer may be disposed on a bottom surface of the lower semiconductor chip. A stack thickness of the lower semiconductor chip and the mold layer on the bottom surface of the lower semiconductor chip may be smaller than a thickness of the at least one lower bump.

The electronic device may include a second radiation element disposed between the main substrate and the mold layer. A stack thickness of the lower semiconductor chip, the mold layer, and the second radiation element may be substantially equal to a thickness of the at least one lower bump.

According to one or more exemplary embodiments of the inventive concept, a data storage device includes a package substrate, and a first memory chip disposed on a top surface of the package substrate. A control chip is disposed on a bottom surface of the package substrate. At least one bump is disposed on the bottom surface of the package substrate and spaced apart from the control chip. The at least one bump is thicker than the control chip.

The data storage device may include a second memory chip disposed on the bottom surface of the package substrate and spaced apart from the control chip. The second memory chip may be thinner than the at least one bump.

The data storage device may include a mold layer disposed on the bottom surface of the package substrate to cover the control chip. The at least one bump may include a through-mold via passing through the mold layer.

The data storage device may include a passive device disposed on the top surface of the package substrate and spaced apart from the first memory chip.

The data storage device may include a radiation element disposed on a bottom surface of the control chip. A stack thickness of the control chip and the radiation element may be smaller than a thickness of the at least one bump.

According to one or more exemplary embodiments of the inventive concept, an electronic device includes a first substrate, and at least one first bump disposed on the first substrate. A second substrate is disposed on the at least one first bump. The second substrate has an area smaller than the first substrate. At least one second bump is disposed on the second substrate. A memory chip is disposed on the at least one second bump. A control chip is disposed between the at least one first bump and between the first and second substrates. The control chip is thinner than the at least one first bump.

The electronic device may include a mold layer disposed between the first substrate and the second substrate, and a through-mold via passing through the mold layer and connecting the first and second substrates to each other.

The mold layer may cover the control chip. A stack thickness of the control chip and the mold layer on a bottom surface of the control chip may be smaller than a thickness of the at least one first bump.

The electronic device may include a first radiation element disposed between the first substrate and the mold layer. A stack thickness of the control chip, the mold layer, and the first radiation element may be substantially equal to a thickness of the at least one first bump.

The electronic device may include a second radiation element disposed on a bottom surface of the control chip. A stack thickness of the control chip and the second radiation element may be smaller than a thickness of the east least one first bump.

The at least one first bump may be thicker than the at least one second bump.

BRIEF DESCRIPTION OF THE DRAWINGS

The above and other features of the present inventive concept will become more apparent by describing in detail exemplary embodiments thereof, with reference to the accompanying drawings in which.

DETAILED DESCRIPTION

Figure 1:
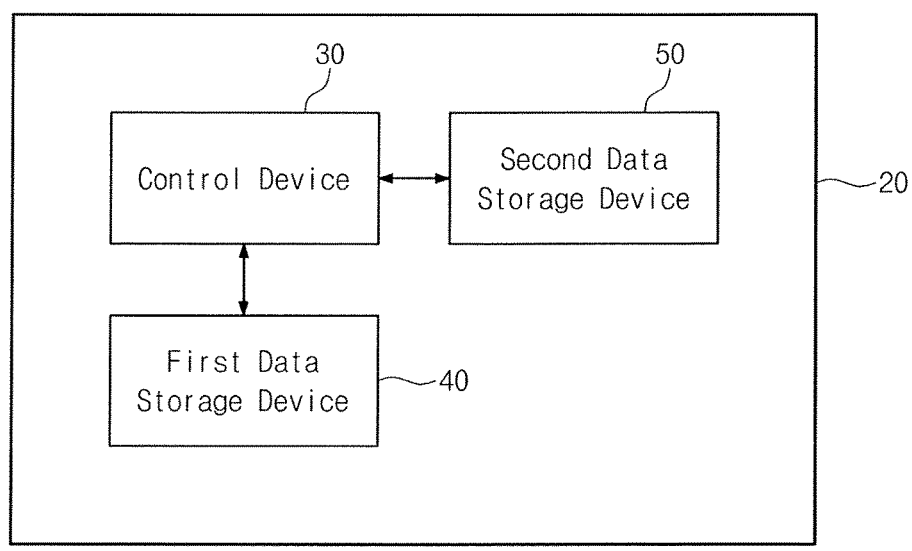
FIG. 1 is a plan view illustrating an electronic device according to an exemplary embodiment of the present inventive concept.

Exemplary embodiments of the present inventive concept will now be described in more detail with reference to the accompanying drawings in which exemplary embodiments are shown. Exemplary embodiments of the present inventive concept may, however, may be embodied in various different forms, and should not be construed as being limited to the exemplary embodiments described herein.

It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it may be directly on the other element or intervening elements may be present. Exemplary embodiments of the present inventive concept may be described with reference to cross-sectional views. Accordingly, shapes of the exemplary views may be modified according to manufacturing techniques and/or allowable errors. Thus, exemplary embodiments of the present inventive concept are not limited to the specific shape illustrated in the exemplary views, but may include other shapes that may be created according to, for example, manufacturing processes.

Exemplary embodiments of the present inventive concept described herein may include their complementary counterparts. The same reference numerals or the same reference designators may refer to the same elements throughout the specification and drawings.

FIG. 1 is a plan view illustrating an electronic device according to an exemplary embodiment of the present inventive concept.

Referring to FIG. 1, an electronic device 10 according to an exemplary embodiment of the present inventive concept may include a main substrate 20, a control device 30, a first data storage device 40, and a second data storage device 50. The control device 30, the first data storage device 40, and the second data storage device 50 may be disposed on the main substrate 20. According to an exemplary embodiment of the present inventive concept, at least one of an interface, an input/output device, a graphic card, a LAN card, and a sound card may be disposed on the main substrate 20. The control device 30 may control the first data storage device 40 and the second data storage device 50. According to an exemplary embodiment of the present inventive concept, the control device 30 may perform an operation of writing or reading data to or from one or both of the first and second data storage devices 40 and 50. The control device 30 may include, for example, a central processing unit (CPU). The first data storage device 40 may be used to temporarily store control signals of the control device 30. For example, the first data storage device 40 may include at least one DRAM chip. Alternatively, the first data storage device 40 may include at least one SRAM chip. The first data storage device 40 with the SRAM chip and the control device 30 may be included in a single device. The second data storage device 50 may be used to non-temporarily store data output from the control device 30. According to an exemplary embodiment of the present inventive concept, the second data storage device 50 may include at least one nonvolatile memory device. For example, the second data storage device 50 may include a solid-state drive (SSD).

Figure 2:
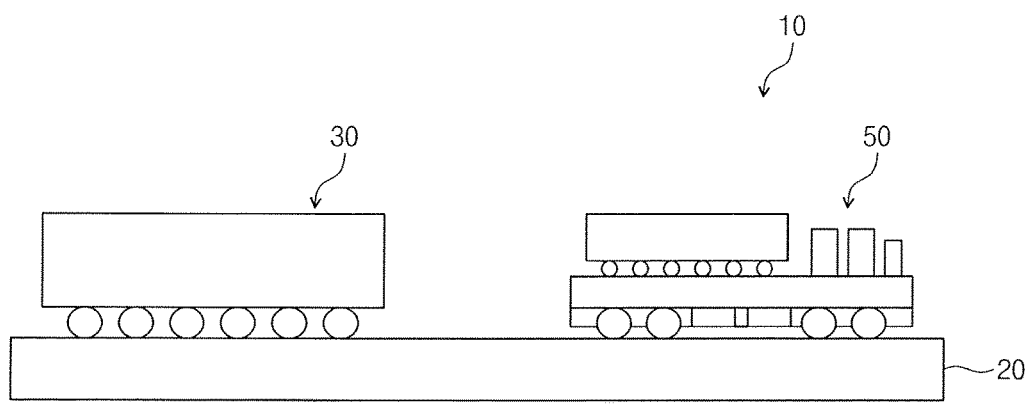
FIG. 2 is a cross-sectional view illustrating a main substrate, a control device, and a second data storage device according to an exemplary embodiment of the present inventive concept.

FIG. 2 is a cross-sectional view illustrating a main substrate, a control device, and a second data storage device according to an exemplary embodiment of the present inventive concept.

Referring to FIG. 2, the control device 30 and the second data storage device 50 may be disposed on the main substrate 20. The main substrate 20 may be larger than the control device 30 and the second data storage device 50. The control device 30 may be spaced apart from the second data storage device 50. Alternatively, the control device 30 and the second data storage device 50 may be disposed on top and bottom surfaces, respectively, of the main substrate 20.

Figure 3:
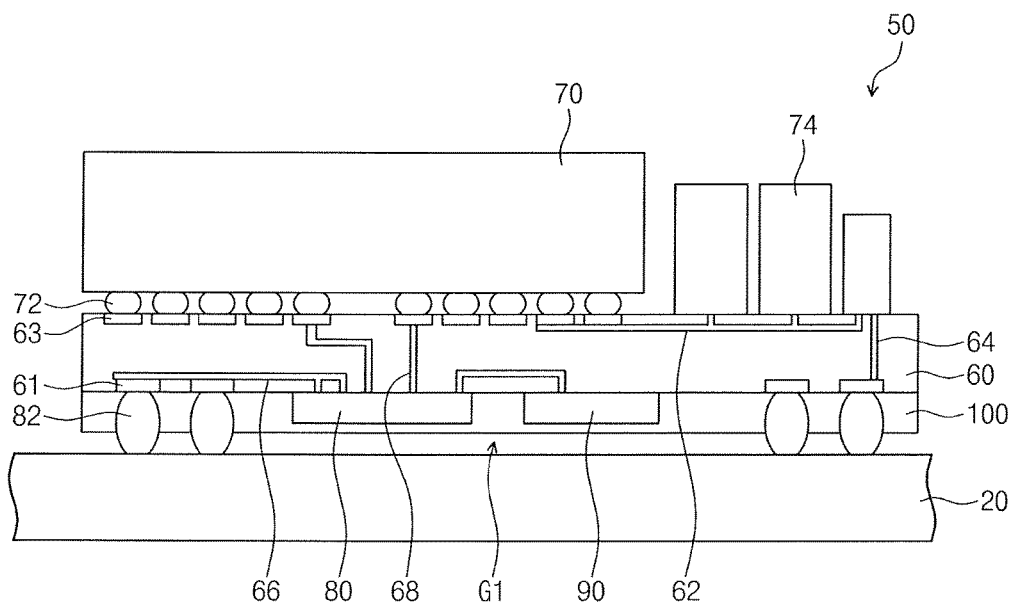
FIG. 3 is a cross-sectional view illustrating a second data storage device according to an exemplary embodiment of the present inventive concept.

FIG. 3 is a cross-sectional view illustrating a second data storage device according to an exemplary embodiment of the present inventive concept.

Referring to FIG. 3, the second data storage device 50 may include a package substrate 60, a first memory chip 70, passive devices 74, a control chip 80, and a second memory chip 90.

The first memory chip 70, the passive devices 74, the control chip 80, and the second memory chip 90 may be disposed on the package substrate 60. According to an exemplary embodiment of the present inventive concept, the package substrate 60 may include a lower interconnection pad 61, an upper interconnection pad 63, a first interconnection line 62, a second interconnection line 64, a third interconnection line 66, and a fourth interconnection line 68. The lower interconnection pad 61 may be disposed on a bottom surface of the package substrate 60. The upper interconnection pad 63 may be disposed on a top surface of the package substrate 60. The first to fourth interconnection lines 62, 64, 66, and 68 may be disposed in the package substrate 60.

The package substrate 60 may be smaller than the main substrate 20. The package substrate 60 may be disposed on the main substrate 20. The package substrate 60 and the main substrate 20 may be substantially parallel to each other. According to an exemplary embodiment of the present inventive concept, lower bumps 82 may be disposed between the top surface of the main substrate 20 and the bottom surface of the package substrate 60. The lower bumps 82 may electrically connect the main substrate 20 to the package substrate 60. For example, the lower bumps 82 may be disposed between the lower interconnection pad 61 and the main substrate 20. The lower bumps 82 may penetrate a lower mold layer 100. For example, the lower bumps 82 may include through-mold vias (TMVs). The lower mold layer 100 may be disposed between the package substrate 60 and the main substrate 20.

The first memory chip 70 and the passive devices 74 may be disposed on the top surface of the package substrate 60. The first memory chip 70 may be connected to the package substrate 60 through upper bumps 72. The upper bumps 72 may serve as data transmission lines between the first memory chip 70 and the package substrate 60. According to an exemplary embodiment of the present inventive concept, the upper bumps 72 may be smaller than the lower bumps 82. For example, the number of the upper bumps 72 may be from about 100 to about 300. Each of the upper bumps 72 may electrically connect the first memory chip 70 to the upper interconnection pad 63 of the package substrate 60. The first memory chip 70 may be configured to non-temporarily store data. According to an exemplary embodiment of the present inventive concept, the first memory chip 70 may include a non-volatile memory device. For example, the first memory chip 70 may include a plurality of vertically-stacked NAND FLASH memory chips.

The passive devices 74 may be spaced apart from the first memory chip 70. At least one of the passive devices 74 may be configured to lower a level of a voltage to be supplied to the first memory chip 70. According to an exemplary embodiment of the present inventive concept, at least one of the passive devices 74 may be configured to store or delay a current to be supplied to the first memory chip 70. For example, the passive devices 74 may include at least one of a capacitor, a resistor, and an inductor. The passive devices 74 and the first memory chip 70 may be connected to each other through the upper bumps 72, the upper interconnection pad 63, and the first interconnection line 62. The first interconnection line 62 may extend in a direction substantially parallel to the top surface of the main substrate 20. The first interconnection line 62 may connect the upper interconnection pad 63 to at least one of the passive devices 74. The second interconnection line 64 may connect at least one of the passive devices 74 to the lower interconnection pad 61. The second interconnection line 64 may extend in a direction substantially perpendicular to the top surface of the main substrate 20.

The control chip 80 and the second memory chip 90 may be disposed on the bottom surface of the package substrate 60. According to an exemplary embodiment of the present inventive concept, the lower bumps 82 may be arranged to enclose the control chip 80 and the second memory chip 90. The lower mold layer 100 may cover the control chip 80 and the second memory chip 90.

The control chip 80 and the lower bumps 82 may be connected to each other through the lower interconnection pad 61 and the third interconnection line 66. The lower bumps 82 may serve as data I/O terminals between the control chip 80 and the control device 30. For example, the number of the lower bumps 82 may be the same as that of the number of upper bumps 72. For example, the number of the lower bumps 82 may be from about 100 to about 300. The third interconnection line 66 may extend substantially parallel to the first interconnection line 62. The third interconnection line 66 may be disposed below the first interconnection line 62. The third interconnection line 66 may connect the control chip 80 to the second memory chip 90. The fourth interconnection line 68 may extend substantially parallel to the second interconnection line 64. The fourth interconnection line 68 may connect the control chip 80 to the upper interconnection pad 63. The control chip 80 may be connected to the first memory chip 70 through the upper bumps 72, the upper interconnection pad 63, and the fourth interconnection line 68.

The control chip 80 may control the first memory chip 70 and the second memory chip 90. According to an exemplary embodiment of the present inventive concept, the control chip 80 may be configured to perform an operation of writing or reading data to or from one or both of the first and second memory chips 70 and 90. For example, the control chip 80 may include an application processor (AP) chip. The control chip 80 may be thinner than the lower bumps 82. A stack thickness of the control chip 80 and the lower mold layer 100 under the control chip 80 may be smaller than a thickness of each of the lower bumps 82. The lower bumps 82 may have a thickness that is substantially equal to a distance between the main substrate 20 and the package substrate 60.

The POP structure may include a lower package and an upper package on the lower package. The lower package may include a lower substrate, lower bumps, and a memory control chip. The upper package may include an upper substrate, upper bumps, and a memory chip. The stack thickness of the POP structure may be the sum of thicknesses of the lower substrate, the lower bumps, the memory control chip, the upper substrate, the upper bumps, and the memory chip.

The data storage device 50 according to an exemplary embodiment of the present inventive concept may have a stack thickness that is the sum of thicknesses of the lower bumps 82, the package substrate 60, the upper bumps 72, and the first memory chip 70. For example, the presence of the control chip 80 may lead to an increase of the stack thickness of the data storage device 50. Thus, the stack thickness of the data storage device 50 may be smaller than that of the POP structure. Thus, the data storage device 50 may have a signal transmission length shorter than that of the POP structure.

The second memory chip 90 may be used to temporarily store data. For example, the second memory chip 90 may include at least one DRAM chip. Alternatively, the second memory chip 90 may be used to non-temporarily store data. The second memory chip 90 may include at least one SRAM chip. The second memory chip 90 may have a thickness that is smaller than that of the lower bumps 82 and is substantially equal to that of the control chip 80.

Heat may be generated from the control chip 80 when data is processed by the control chip 80. According to an exemplary embodiment of the present inventive concept, the electronic device 10 may have a first air gap G1 between the main substrate 20 and the control chip 80. The control chip 80 may be cooled by an air 120 (see, e.g., FIG. 4) flowing through the first air gap G1.

Figure 4:
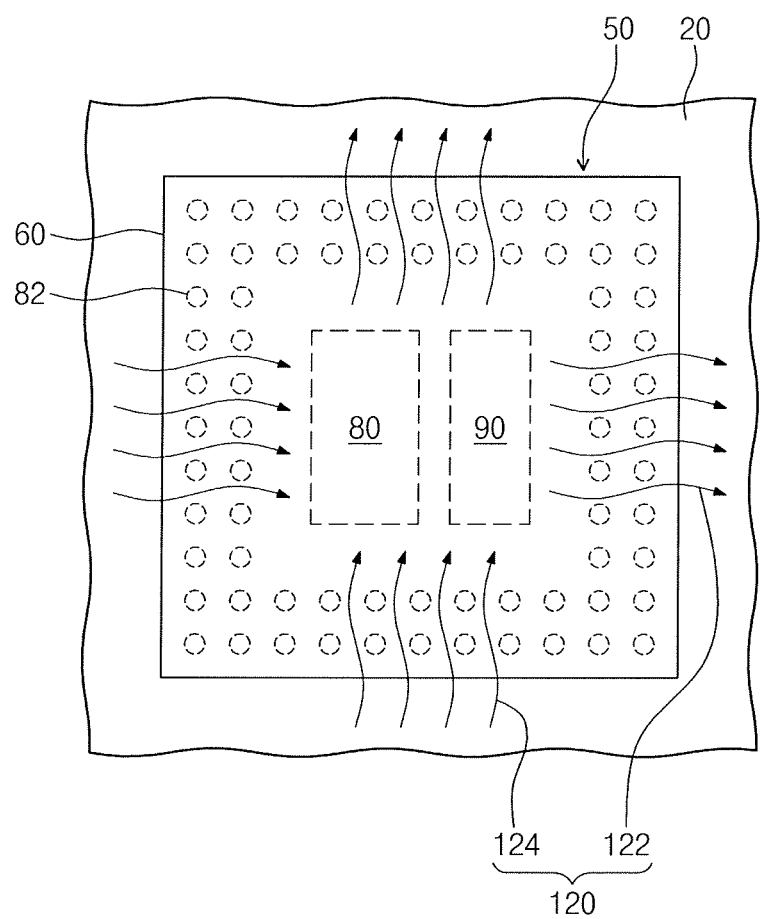
FIG. 4 is a plan view illustrating a flow of air flowing through an air gap between the second data storage device and the main substrate of FIG. 3.

FIG. 4 is a plan view illustrating a flow of air flowing through an air gap between the second data storage device and the main substrate of FIG. 3.

Referring to FIG. 4, air 120 may be heated by the control chip 80, and heated air 122 may be exhausted to an outer region of the package substrate 60. The main substrate 20 may be larger than the package substrate 60 in a plan view. As a result of convection, cool air 124 may be supplied to a region below the package substrate 60 from a region outside the control chip 80. The lower bumps 82 may be arranged at or along an edge region of the package substrate 60, and thus, the heated air 122 and the cool air 124 may flow through spaces between the lower bumps 82. Thus, the control chip 80 may be cooled (e.g., to about room temperature) by the air 120.

Referring to FIG. 3, the first air gap G1 may be defined as an empty space that is positioned below the control chip 80 and between the lower mold layer 100 and the main substrate 20. According to an exemplary embodiment of the present inventive concept, the first air gap G1 may serve as an air passage for ventilation of the air 120. The lower mold layer 100 below the control chip 80 may be an air cooling, heat-dissipation layer. The control chip 80 may be cooled by the lower mold layer 100 and the air 120 in the first air gap G1.

Figure 5:
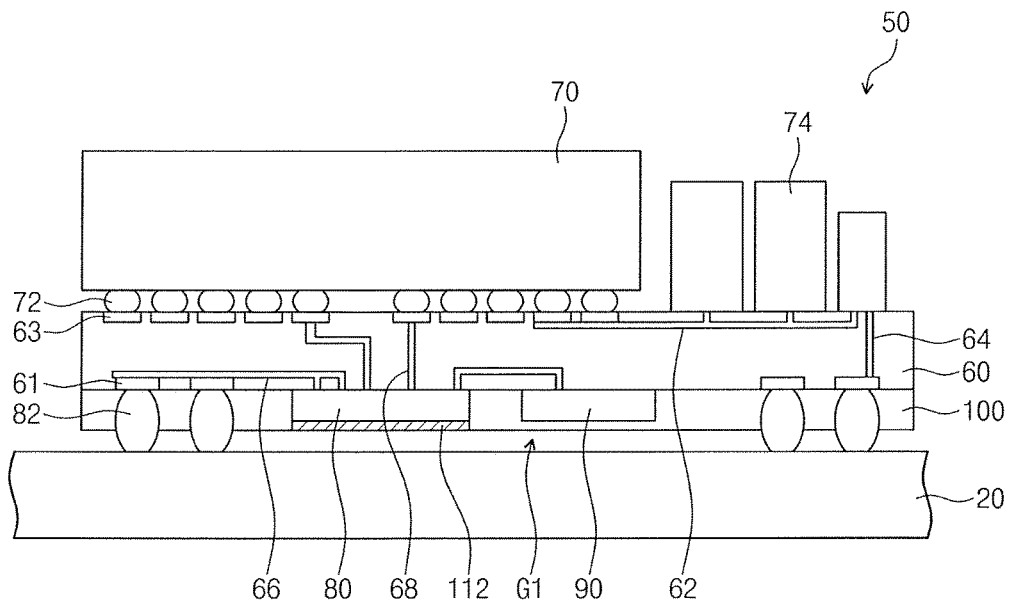
FIG. 5 is a cross-sectional view illustrating a second data storage device according to an exemplary embodiment of the present inventive concept.

FIG. 5 is a cross-sectional view illustrating a second data storage device according to an exemplary embodiment of the present inventive concept.

Referring to FIG. 5, the second data storage device 50 may include a first radiation element 112. The first radiation element 112 may be disposed between the control chip 80 and the first air gap G1. For example, the first radiation element 112 may include a conductive silver paste or a metal block. The first radiation element 112 may allow heat generated from the control chip 80 to be transferred to the air 120 in the first air gap G1. Thus, the control chip 80 may be cooled by the first radiation element 112 and the air 120 in the first air gap G1. Alternatively, the first radiation element 112 may fill a gap region between the control chip 80 and the main substrate 20, without the first air gap G1.

Each of the package substrate 60, the first memory chip 70, the upper bumps 72, the passive devices 74, the control chip 80, the lower bumps 82, and the second memory chip 90 described with reference to FIG. 5 may be substantially the same as the corresponding components described with reference to FIG. 3, and thus duplicative descriptions may be omitted.

Figure 6:
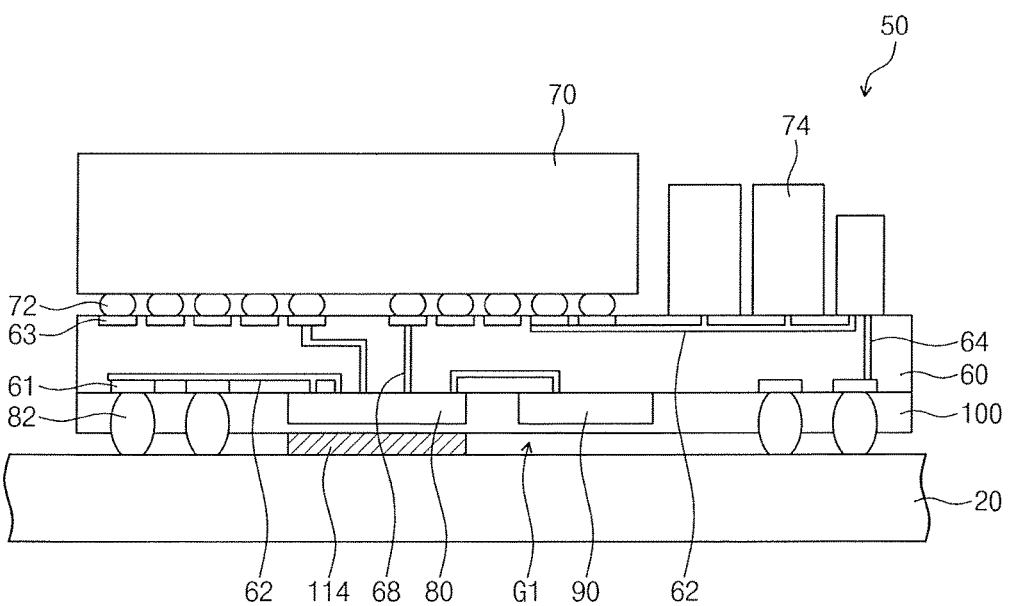
FIG. 6 is a cross-sectional view illustrating a second data storage device according to an exemplary embodiment of the present inventive concept.

FIG. 6 is a cross-sectional view illustrating a second data storage device according to an exemplary embodiment of the present inventive concept.

Referring to FIG. 6, the second data storage device 50 may include a second radiation element 114. The second radiation element 114 may be disposed below the control chip 80 and between the lower mold layer 100 and the main substrate 20. According to an exemplary embodiment of the present inventive concept, the second radiation element 114 may be disposed between the main substrate 20 and the lower mold layer 100. The second radiation element 114 may be in contact with the top surface of the main substrate 20 and the bottom surface of the lower mold layer 100. The second radiation element 114 may be configured to allow heat generated from the control chip 80 to be transferred to the main substrate 20. For example, the second radiation element 114 may include a conductive silver paste, a metal block, or an under fill structure. According to an exemplary embodiment of the present inventive concept, the second radiation element 114 may be exposed to the first air gap G1 between the lower mold layer 100 and the main substrate 20. The second radiation element 114 may be cooled by the air 120 (see, e.g., FIG. 4) flowing through the empty space between the lower mold layer 100 and the main substrate 20.

Each of the package substrate 60, the first memory chip 70, the upper bumps 72, the passive devices 74, the control chip 80, the lower bumps 82, and the second memory chip 90 described with reference to FIG. 6 may be substantially the same as the corresponding component described with reference to FIG. 3, and thus duplicative descriptions may be omitted.

Figure 7:
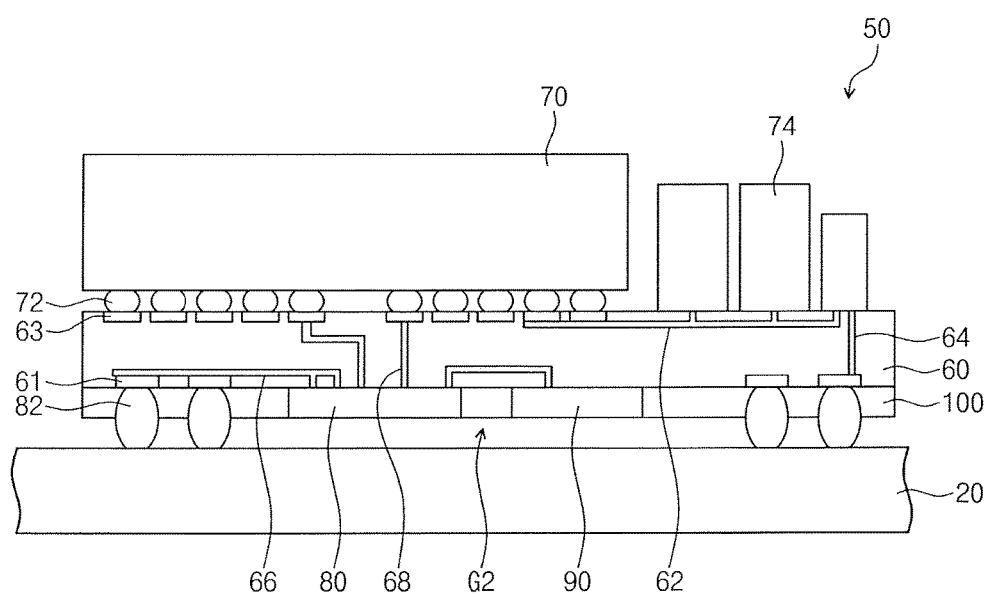
FIG. 7 is a cross-sectional view illustrating a second data storage device according to an exemplary embodiment of the present inventive concept.

FIG. 7 is a cross-sectional view illustrating a second data storage device according to an exemplary embodiment of the present inventive concept.

Referring to FIG. 7, the lower mold layer 100 may expose the control chip 80. A second air gap G2 may be defined as an empty space between the control chip 80 and the main substrate 20. The control chip 80 may be cooled by the air 120 flowing through the second air gap G2. The second memory chip 90 may be exposed to the second air gap G2. According to an exemplary embodiment of the present inventive concept, the lower mold layer 100 may cover the second memory chip 90. The second air gap G2 may be formed by removing the lower mold layer 100 from the bottom surface of the control chip 80. A height of the second air gap G2 may be greater than that of the first air gap G1, when measured from the main substrate 20.

Each of the package substrate 60, the first memory chip 70, the upper bumps 72, the passive devices 74, the control chip 80, the lower bumps 82, and the second memory chip 90 described with reference to FIG. 7 may be substantially the same as the corresponding component described with reference to FIG. 3, and thus duplicative descriptions may be omitted.

According to exemplary embodiments of the inventive concept, a data storage device may be disposed on a main substrate. The data storage device may include a package substrate, a memory chip, and a control chip. The memory chip may be disposed on the package substrate. The control chip may be disposed between the package substrate and the main substrate. The control chip may be efficiently cooled by an air flowing through an air gap between the main substrate and the control chip.

While the present inventive concept has been particularly shown and described with reference to exemplary embodiments thereof, it will be understood by those of ordinary skill in the art that various changes in form and detail may be made therein without departing from the spirit and scope of the present inventive concept.

What is claimed is:
1. A data storage device, comprising:
a package substrate;

an upper semiconductor chip disposed above a top surface of the package substrate;
at least one lower bump disposed on a bottom surface of the package substrate; and
a lower semiconductor chip disposed on the bottom surface of the package substrate and spaced apart from the at least one lower bump, the lower semiconductor chip being thinner than the at least one lower bump.

2. The data storage device of claim 1, wherein the upper semiconductor chip comprises a first memory chip, and the lower semiconductor chip comprises a control chip controlling the first memory chip.

3. The data storage device of claim 2, further comprising a second memory chip disposed on the bottom surface of the package substrate and spaced apart from the control chip.

4. A data storage device, comprising:
a package substrate;
an upper semiconductor chip disposed above a top surface of the package substrate;
at least one lower bump disposed on a bottom surface of the package substrate; and a lower semiconductor chip disposed on the bottom surface of the package substrate and spaced apart from the at least one lower bump, the lower semiconductor chip being thinner than the at least one lower bump, wherein the upper semiconductor chip comprises a first memory chip, and the lower semiconductor chip comprises a control chip controlling the first memory chip,
wherein the package substrate comprises:
a first interconnection line connecting the control chip to the first memory chip and extending in a first direction; and
a second interconnection line connecting the at least one lower bump to the control chip and extending in a second direction crossing the first direction.

5. The data storage device of claim 1, further comprising a mold layer disposed on the bottom surface of the package substrate.

6. The data storage device of claim 5, wherein the at least one lower bump comprises a through-mold via passing through the mold layer.

7. The data storage device of claim 1, further comprising a passive device disposed on the package substrate and spaced apart from the upper semiconductor chip.

8. The data storage device of claim 7, further comprising at least one upper bump disposed between the upper semiconductor chip and the package substrate.

9. The data storage device of claim 8, wherein the package substrate comprises a third interconnection line connecting the at least one upper bump to the passive device.

10. The data storage device of claim 1, further comprising a radiation element disposed on a bottom surface of the control chip,
wherein a stack thickness of the control chip and the radiation element is smaller than a thickness of the at least one lower bump.

11. An electronic device, comprising:
a main substrate; and
a data storage device disposed on a top surface of the main substrate,
wherein the data storage device comprises:
a package substrate smaller than the main substrate;
an upper semiconductor chip disposed above a top surface of the package substrate;
at least one lower bump disposed on a bottom surface of the package substrate; and
a lower semiconductor chip disposed on the bottom surface of the package substrate and spaced apart from the at least one lower bump, the lower semiconductor chip being thinner than the at least one lower bump.

12. The electronic device of claim 11, further comprising a first radiation element disposed on a bottom surface of the lower semiconductor chip,
wherein a stack thickness of the lower semiconductor chip and the first radiation element is smaller than a thickness of the at least one lower bump.

13. The electronic device of claim 11, wherein the data storage device comprises a mold layer disposed between the package substrate and the main substrate, and
wherein the at least one lower bump comprises a through-mold via passing through the mold layer.

14. The electronic device of claim 13, wherein the mold layer is disposed on a bottom surface of the lower semiconductor chip, and
a stack thickness of the lower semiconductor chip and the mold layer on the bottom surface of the lower semiconductor chip is smaller than a thickness of the at least one lower bump.

15. The electronic device of claim 14, further comprising a second radiation element disposed between the main substrate and the mold layer,
wherein a stack thickness of the lower semiconductor chip, the mold layer, and the second radiation element is substantially equal to a thickness of the at least one lower bump.

16. A data storage device, comprising:
a package substrate;
a first memory chip disposed on a top surface of the package substrate;
a control chip disposed on a bottom surface of the package substrate; and
at least one bump disposed on the bottom surface of the package substrate and spaced apart from the control chip, the at least one bump being thicker than the control chip.

17. The data storage device of claim 16, further comprising a second memory chip disposed on the bottom surface of the package substrate and spaced apart from the control chip, the second memory chip being thinner than the at least one bump.

18. The data storage device of claim 16, further comprising a mold layer disposed on the bottom surface of the package substrate to cover the control chip,
wherein the at least one bump comprises a through-mold via passing through the mold layer.

19. The data storage device of claim 16, further comprising a passive device disposed on the top surface of the package substrate and spaced apart from the first memory chip.

20. The data storage device of claim 16, further comprising a radiation element disposed on a bottom surface of the control chip,
wherein a stack thickness of the control chip and the radiation element is smaller than a thickness of the at least one bump.

* * * * *